(12) United States Patent
Johansen et al.

(10) Patent No.: US 10,781,520 B2
(45) Date of Patent: Sep. 22, 2020

(54) METALLIC SHEET WITH DEPOSITED STRUCTURED IMAGES AND METHOD OF MANUFACTURE

(71) Applicants: Laurie Johansen, Grants Pass, OR (US); Adam Trexler, Portland, OR (US); Paul Diffendaffer, Grants Pass, OR (US)

(72) Inventors: Laurie Johansen, Grants Pass, OR (US); Adam Trexler, Portland, OR (US); Paul Diffendaffer, Grants Pass, OR (US)

( * ) Notice: Subject to any disclaimer, the term of this patent is extended or adjusted under 35 U.S.C. 154(b) by 0 days.

(21) Appl. No.: 15/831,108

(22) Filed: Dec. 4, 2017

(65) Prior Publication Data

US 2019/0169755 A1 Jun. 6, 2019

(51) Int. Cl.
| | |
|---|---|
| B32B 3/02 | (2006.01) |
| C23C 30/00 | (2006.01) |
| B05D 3/00 | (2006.01) |
| C23C 14/58 | (2006.01) |
| B44C 1/00 | (2006.01) |
| C23C 14/20 | (2006.01) |

(52) U.S. Cl.
CPC .............. *C23C 30/00* (2013.01); *B05D 3/002* (2013.01); *B44C 1/00* (2013.01); *C23C 14/205* (2013.01); *C23C 14/588* (2013.01)

(58) Field of Classification Search
CPC ............ B05D 3/002; C23C 30/00; B32B 3/00
See application file for complete search history.

(56) References Cited

U.S. PATENT DOCUMENTS

| | | | |
|---|---|---|---|
| 4,591,707 A | 5/1986 | Stenzel et al. | |
| 7,867,686 B2 | 1/2011 | Bamach et al. | |
| 2005/0184409 A1 | 8/2005 | Volkov et al. | |
| 2008/0173917 A1 | 7/2008 | Patz et al. | |
| 2013/0003150 A1* | 1/2013 | Camus | G03H 1/24 359/2 |
| 2018/0081265 A1* | 3/2018 | Singh | G03F 7/0005 |
| 2018/0104975 A1* | 4/2018 | Nagano | G02B 5/1842 |

FOREIGN PATENT DOCUMENTS

EP 2453269 A 5/2012

* cited by examiner

*Primary Examiner* — Elizabeth E Mulvaney
(74) *Attorney, Agent, or Firm* — Kilpatrick Townsend & Stockton LLP

(57) ABSTRACT

A metallic sheet with deposited structured images and method for manufacture (MSDIMM) that includes a substrate, at least one structural feature, and a metal layer. The structural feature is at least one cavity on the substrate's upper surface, or at least one material object that extends outward from the substrate's upper surface. The metal layer is deposited, either by sputtering or atomic deposition, onto the substrate's upper surface, and, as the metal layer is deposited, the metal layer interfaces with and follows the dimensions of the structural feature(s), thereby creating a visible image at the location(s) of the structural feature(s). The visible image can be any image, and is preferably either an artistic image, a textual image, or an authentication image. The MDSIMM can be used for a variety of purposes, and is especially effective as a form of exonumia or currency.

30 Claims, 4 Drawing Sheets acquire a substrate with an upper surface, a lower surface, and a side edge,

modify the substrate by creating at least one structural feature larger than fifty microns or a non-repeating pattern smaller than 50 microns on the substrate's upper surface,

deposit a metal layer onto the substrate's upper surface thereby creating at one visible image where the metal layer interfaces with and follows the dimensions of the structural feature.

METALLIC SHEET WITH DEPOSITED STRUCTURED IMAGES AND METHOD OF MANUFACTURE

TECHNICAL FIELD

The invention generally pertains to metallic film, and more particularly to a three-dimensionally structured metallic sheet that includes artistic, textual or authentication devices, and a method of manufacturing the metallic sheet.

BACKGROUND ART

Thin metal layers have been in existence for thousands of years. Thin metal used for decorative coatings such as gold leaf were used in India more than 5,000 years ago. As time progressed, the uses of thin metal layers have grown. Today thin metal layers can be used as: a protective coating to provide a barrier over an underlying item, as electrical operating coatings in electrical devices due to some metal films ability to transport electrical currents or supply voltages, as thin film photovoltaic cells to produce comparatively low cost solar cells, and as thin film printing to create batteries (and other items) for specialized applications.

The actual application of thin metallic film to a surface can be done by deposition, which falls into two broad categories: chemical or physical. Regardless of the deposition method that is used, the desired outcome is the deposition of a thin film of metallic material on a surface, which is referred to as a substrate. Another method to create a thin metal layer is to laminate multiple layers to create a single composite sheet of thin metal.

Once a thin metal sheet has been created, various types of "indicia" can be produced into or onto the sheet. In the packaging industry, metallized film is overprinted with pictures and words to describe the product that is contained within the film wrapper. Another example is in the precious metal industry, where coins of precious metal may be embossed to create a product with intrinsic, aesthetic, or monetary value. An example of this is to deposit a precious metal to produce the thin film sheet, thereby creating inherent and/or asthetic value. The indicia could then consist of various identifying text or images that define the value of, origin of, or other information which would establish the sheet as a form of currency or exonumia.

Whether the metal layer is a precious metal or not, a thin metal sheet can be used for many purposes, for example as an artistic "canvas", as a means of establishing identity, a packaging substance, or as an authentication device.

Unfortunately, due to the fact that a conventional thin film sheet is essentially a flat surface, the indicia and/or images thereon are limited to two dimensional representations. Even when etched or laser produced the manufacturing process limits how a visible image or/in a thin film sheet will appear.

A second limitation of conventional thin film sheets is that printing is not intrinsic to the metallic film. Printing processes are generally more accessible and cheaper than deposition processes. In conventional printed films, whether the film is printed or marked before or after (or both), the printing process is not intrinsically connected to the deposition process. This opens the door to fraudulent marking of the film, with a less expensive or inauthentic film being mislabeled.

What is needed is a method by which three-dimensional (3-D) relief images can be created in/on a thin film metallic sheet. The images could be any design or text, and when a precious metal is used as the metal layer, the resulting device could be used as exonumia or currency. A thin film sheet such as this would provide a significant increase in the artistic potential, as well as increase the overall functionality and usefulness of the thin film sheet.

If the film were wholly structured with three-dimensional images or texts, the authenticity of the film would be more assured. It would not be possible to repurpose off-the-shelf or substandard films using cheap counterfeit printing. The very structure of the three-dimensional film would describe its purpose and be a mark of its authenticity. Unique serial numbers and identifying features would be tied to the specific film, and product, in question.

Unlike previous methods to create visual effects by modifying the surface, this method creates 3-D features that are an intrinsic part of the entire structure, and not just laminated, printed, or embossed onto the structure as is commonly done with coins and other metallic objects. By having the indicia a part of the entire structure, it makes the whole unit more difficult to falsely re-label or counterfeit.

A search of the prior art did not disclose any literature or patents that read directly on the claims of the instant invention. However, the following U.S. patents are considered related:

| PAT. NO. | INVENTOR | ISSUED |
|---|---|---|
| 4,591,707 | Stenzel et al | May 27, 1986 |
| 7,867,686 | Banach et al | Jan. 11, 2011 |
| 2004/0785170 | Volkov et al | Publi. Date: Aug. 25, 2005 |
| 2008/0173917 | Patz, et al | Publi. Date: Jul. 24, 2008 |
| EP 2453269A1 | Lochbihler | Nov. 8, 2011 |

The U.S. Pat. No. 4,591,707 patent discloses a security paper with a hallmark in the form of a coating applied by vacuum deposition techniques to the surface of a paper substrate. The coating is thin and almost invisible to the naked eye even as a metal layer, although permitting accurate automatic or machine examination for verification purposes. The absorption of the hallmarks is in a certain specified range of the wavelength of the spectrum. The photoconductivity and/or the electrical conductivity of the hallmarks are characteristics used during the automatic examination of the authenticity of the security paper.

The U.S. Pat. No. 7,867,686 patent discloses a method for electroless plating of metal on a laser-patterned substrate. A substrate is provided on which both a thermal imaging layer and catalytic layer are deposited. On exposure to a laser beam, sufficient levels of radiation are converted to heat in the thermal imaging layer to render the exposed regions of the adjacent catalytic layer inactive. The laser-patterned substrate is then exposed to a reaction solution which initiates the growth of a metal film on the unexposed regions of the catalytic layer.

The 2004/0785170 publication discloses a decorative mirror with several overlapping and non-continuous reflective metallic layers with different reflective properties deposited on a transparent substrate. Areas where upper layers are visible through voids in the lower layers make patterns that can be alphanumerical, or ornamental, or artistic, or a combination of all for informational and decorative purposes. In order to manufacture the mirror a mask preventing metal deposition is applied before every layer is deposited. The mask is removed after the layer is deposited thus making upper layers visible through the voids in the lower layers.

The 2008/0173917 publication discloses a deposition method that is performed by the following steps. A substrate is provided which is structured to comprise a first surface and a second surface, which differ in at least one of geometric orientation and vertical distance to a principle surface of the substrate. An etchable layer is deposited on the first surface via an atomic layer deposition technique with uses a first precursor supplied in an amount sufficient to cover at least parts of the first surface and insufficient to cover the second surface. The first precursor is supplied from a direction to pass the first surface before the second surface. A dielectric layer of at least one of a transition metal oxide and a transition metal nitride is deposited on at least the second surface via an atomic layer deposition technique using a second precursor.

The EP2453269 patent discloses a thin-film element with a multilayer structure, for security papers and valuable documents. The element comprises at least two metallic layers, and at least one dielectric spacer layer arranged between the two metal layers. The multilayer structure exhibits at least one nano-structured area in which the multilayer structure forms conical- or cone-like elevations. A data carrier comprising a thin-film element, is arranged in or above a transparent window area, or a continuous opening of the data carrier, producing the thin-film element with multilayer structure for security papers and valuable documents. The multilayer structure exhibits a one planar region, comprising a substrate, whose surface exhibits at least one nano-structured area with conical or cone-like elevations, which are arranged a-periodically or periodically, and contains at least one planar region, forming two metallic layers and at least one dielectric spacer layer, which is arranged between the two metallic layers, above the nano-structured region of the substrate surface and above the planar region of the substrate surface by deposition.

For background purposes and indicative of the art to which the invention relates, reference may be made to the following remaining patents found in the patent search.

| PAT. NO. | INVENTOR | ISSUED |
| --- | --- | --- |
| 6,271,592 | Kim et al | Aug. 7, 2001 |
| 6,849,122 | Fair | Feb. 1, 2005 |
| 7,014,709 | Fair | Mar. 21, 2006 |
| 7,192,892 | Ahn et al | Mar. 20, 2007 |
| 7,915,735 | Morgan et al | Mar. 29, 2011 |
| 8,815,344 | Ma | Aug. 26, 2014 |
| 8,946,088 | Boxall et al | Feb. 3, 2015 |
| 2007/0032069 | Morgan et al | Feb. 8, 2007 |
| 2008/0283275 | Banach et al | Nov. 20, 2008 |

DISCLOSURE OF THE INVENTION

A metallic sheet with deposited structured images and method of manufacture (MSDIMM) that includes a substrate, at least one structural feature and a metal layer. The substrate which can be made of one of many various materials, or a composite of multiple materials, has an upper surface, a lower surface and a side edge.

At least one structural feature includes at least one cavity and/or at least one outward extending material object. Both the cavity or cavities, and the material object or objects, are located on the upper surface of the substrate, and both can be created by various means. Once at least one cavity and/or at least one outward extending material object is/are created, the metal layer is deposited onto the substrate. As the metal layer is deposited, the metal layer interfaces with and follows the dimensions of the structural feature, thereby creating a visible image at the location of the structural feature. The metal layer is preferably deposited by sputtering, although other methods of deposition can also be utilized.

The visible image that is created can be any desired or required image, and preferably consists of either an artistic image, such as a design, a textual image such as letters or words, or an authentication image which can include designs and/or text that allow the metallic sheet to have its validity established or to identify the metallic sheet and/or the bearer thereof. The image may be correctly viewed from either the substrate side, or the deposited side, or both (as in the case of some palindromes). Additionally, the MSDIMM can be used as a form of exonumia or currency. When used as currency or exonumia, the metal layer can be comprised of a precious metal.

The method of manufacture for the MSDIMM includes the following steps:
1) acquire substrate,
2) create at least one structural feature in or on the substrate's upper surface, and
3) deposit a metal layer onto the substrate's upper surface, thereby creating a visible image where the metal layer interfaces with and overlies the structural feature.

In view of the above disclosure, the primary object of the invention is to provide a metallic sheet with deposited structured images and method of manufacture that provides a proprietary metallic sheet with artistic, textual or authentication image(s) which can be used for a variety of purposes. In particular, the object may be used as a form of exonumia or currency.

In addition to the primary object, it is also an object of the invention to provide a metallic sheet with deposited structural images and method of manufacture that:
 can be adapted or designed for use throughout the world,
 has a practical method of manufacture,
 can be made effectively tramper-proof,
 can be used to establish/verify the identity of parcels or persons,
 can be used as a convenient form of currency, exonumia, or stored value,
 is easy to package and transport,
 can include selectable and/or custom visible images,
 is difficult to counterfeit, and
 is an effective alternative to similar devices in use by individuals, corporations/companies, or governments.

These and other objects and advantages of the present invention will become apparent from the subsequent detailed description of the preferred embodiment and the appended claims taken in conjunction with the accompanying drawings.

BRIEF DESCRIPTION OF THE DRAWINGS

FIG. 4 is a flow diagram showing the steps of the method of manufacture of the MSDIMM.

BEST MODE FOR CARRYING OUT THE INVENTION

The best mode for carrying out the invention is presented in terms that disclose a preferred embodiment utilizing multiple selectable materials and processes for a metallic sheet with deposited structured images and method for manufacture (MSDIMM).

The resulting structure of the MSDIMM is a metal layer of potentially variable thickness that is located on top of (or over) a structured substrate which has various features. The inventive novelty is to pattern the substrate structure as a means of creating a pattern in the overlying visible metal layer. The MSDIMM is essentially a new form of metallic product, which can be used for many purposes or applications.

Figure 1:
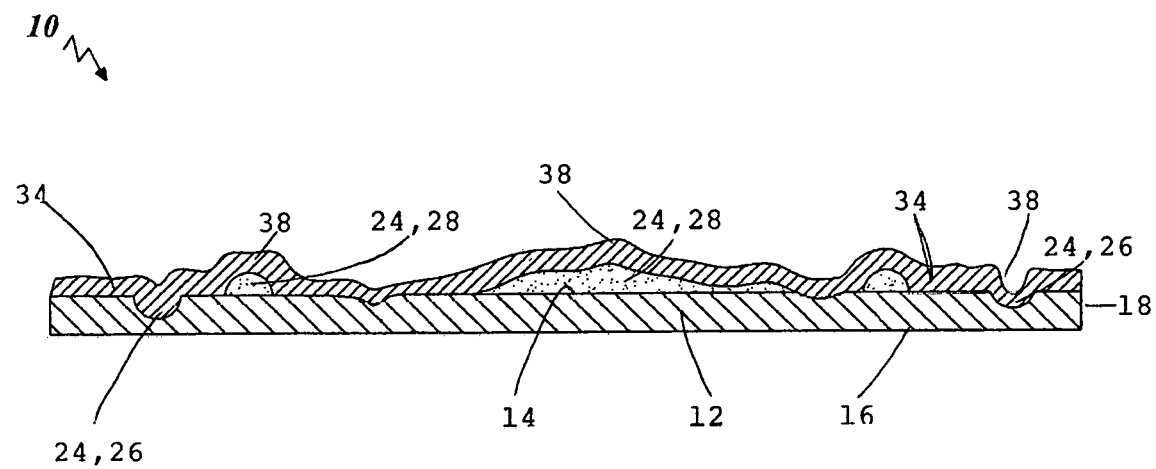
FIG. 1 is a cut-away view of the metallic sheet with deposited structured images and method of manufacture (MSDIMM) showing a substrate, structural features as cavities and outward c material objects, and a deposited metal layer.
Figure 2:
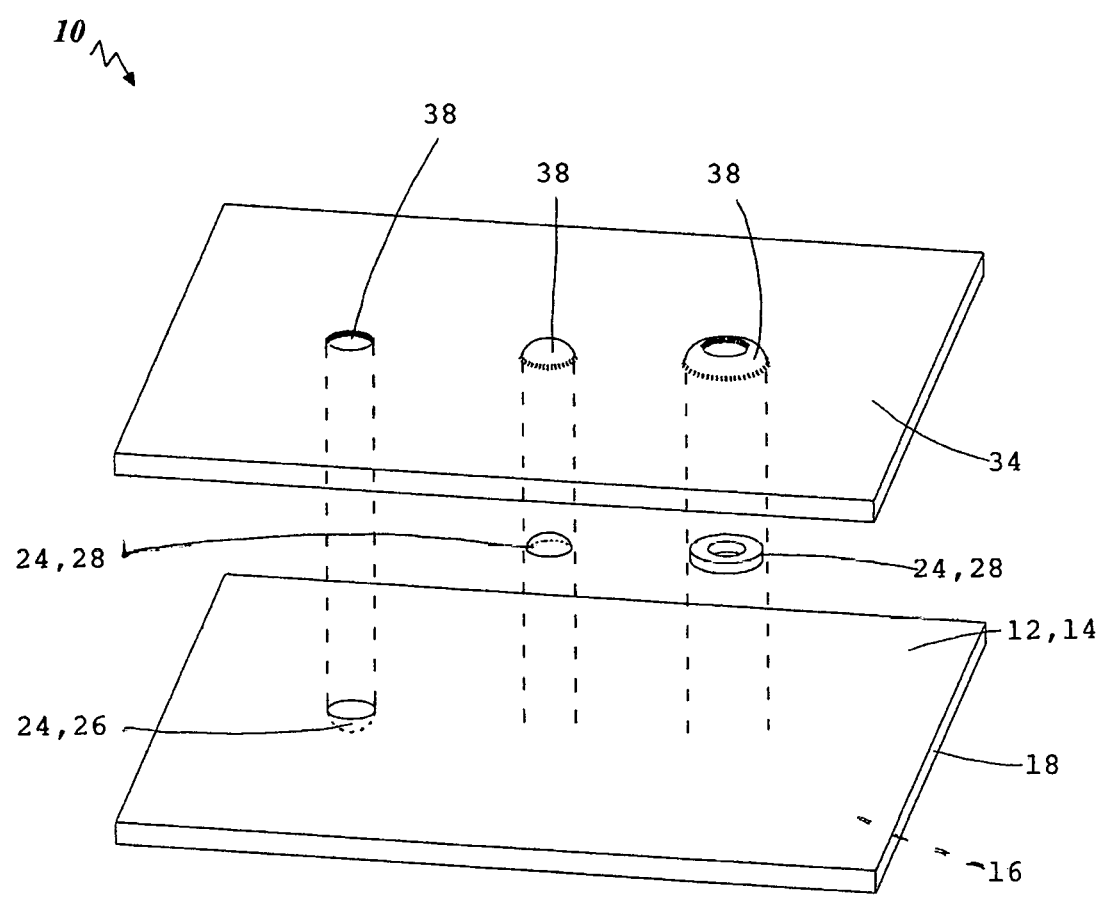
FIG. 2 is an orthographic expanded view of the MSDIMM showing the substrate, structural features as cavities and outward extending material objects, and the metal layer.

The MSDIMM 10, as shown in FIGS. 1-4, is comprised of the following elements: a substrate 12, an image structural feature 24, and a metal layer 34. The substrate 12, as shown in FIGS. 1 and 2, has an upper surface 14, a lower surface 16, and a side edge 18. The substrate 12 can be made of one or multiple materials, selected from a variety of materials including polyethylene terephthalate also known as PET, nylon also known as polyimide, Kapton, polyethylene, polypropylene, polybutylene, polyolefin blends, polyolefin composites polyolefin reinforced with uniaxially oriented polyolefin fibers, spun polyolefin, bonded polyolefin also known as Tyvek, polycarbonate, polystyrene, acrylic also known as polymethylmethacrilate or PMMA, acrylonitrile butadine styrene also known as ABS, polyurethane, celluosics including cellulose triacetate, cellulose diacetate known as cellophane, and blends of tri and diacetate cellulose, nitrocellulose also known as gun cotton, metal foils including aluminum (Al), tin (Sn), copper (Cu), silver (Ag), zinc (Zn), indium (In), magnesium (Mg.), gold (Au), nickel (Ni) stainless steel; paper, parchment, rice paper, and wood pulp paper; polymer-coated woven fabrics; and bioplastics including polylactic acid known as PLA, and PolyVinylChloride also known as PVC, PolyVinylFluoride also known as PVF, PolyVinylideneChloride also known as PVDC, PolyvinylideneFlouride also known as PVDF or PolyvinylideneAlcohol also known as PVDA. While any of the above materials are functionality effective for use as the substrate 12, the choice of a particular material or materials can be selectively determined by the application or use.

The image structure feature 24, as shown in FIGS. 1 and 2, is used in combination with the metal layer 34 to produce a visible image 38 on or in the MSDIMM 10. The image structural feature 24 is comprised of either a cavity 26 or an outward extending material object 28. When multiple cavities 26 and/or outward extending material objects can produce a pattern, on each cavity or material object can be created as an individual pattern within the visible image 38.

As shown in FIGS. 1 and 2, at least one cavity 26 can be created within the substrate's surface by multiple means including heat application; melting; scratching; cutting; impacting; embossing, denting; blistering, surface relief casting, reticulation, bi-phase separation deposition; mud cracking; laser ablation; etching including plasma, laser, ion beam, electron beam, chemical; bead blasting, or sand blasting.

Any of the above means can be used to create the cavity 26 and when multiple cavities 26 are created, they can all be created by one of the means, or each cavity can be created by a particular means.

The outward extending material object 28, as shown in FIGS. 1 and 2, is a structural opposite of the cavity 26. Whereas the cavity 26 extends into the substrate 12, the material object 28 extends outward from the substrate's surface. The outward extending material object 28 can also be created by multiple means, including placing pigmented ink, placing a transparent material, spraying material, printing material, placing material by adhesion, molding, painting, lamination, blistering, surface relief casting, reticulation, bi-phase separation, deposition, sintering, selective chemical vapor deposition, electroless plating, electroplating, and low energy cauliflower growth deposition.

As with the cavity 26, when multiple outward extending material objects 28 are created, they can all be created by one of the means, or each outward extending material object 28 can be created by a particular means. When multiple cavities 26 and/or outward extending material objects 28 are utilized, the cavities and material objects can produce a pattern, or each cavity or material object can be created as an individual pattern within the visible image 38.

After one or multiple cavities 26 and/or outward extending material objects 28 have been created, the metal layer 34 is deposited onto the substrate 12. The metal layer 34 can be deposited by sputtering or atomic deposition, and the metal layer 34 can also comprise variable thickness that is produced by means including laser etching the metal, placing pinholes in the metal, reducing areas of deposition in the metal, chemically etching the metal, or abrading the metal.

As the metal layer 34 is deposited onto the substrate surface, the metal layer 34 interfaces with and follows the dimensions of the image structural feature 24, either/or the cavity 26 or outward extending material object 28, thereby creating the visible image 38 on the metal layer 34 at the location of the image structural feature 24. Instead of being struck or embossed superficially, the atomic structure of the entire metal layer is patterned. The visible image 38 that is created can be any image, and is preferably selected from an artistic image, a textual image or an authentication image. An artistic image would typically include a design and a textual image would include one or multiple letters and/or words. An authentication image includes designs and/or words that can be used to identify and/or establish the validity of the MSDIMM 10. Also, security printing effects, such as microprinting or guilloche could be utilized. Regardless of the type of visible image produced, the visible image 38 is preferably comprised of features larger than fifty microns or non-repeating features having dimensions less than fifty microns. In one design configuration, the MSDIMM 10 is a form of exonumia or currency. When used as currency, the metal layer 34 can be made of a precious metal, thereby producing a MSDIMM with actual tangible value.

It is important to note that the inventive concept of the MSDIMM 10 is to produce a proprietary metallic sheet that includes images, text or other features that facilitate the validation and/or identification of the metallic sheet, or the bearer thereof. Additionally, the visible image(s) can appear as three dimensional (3-D) when viewed.

In order to produce the MSDIMM 10, the method for manufacture is comprised of the following steps, as shown in FIG. 4:

a) acquire a substrate with an upper surface, a lower surface, and a side edge, b) modify the substrate by creating at least one structural feature larger than fifty microns or a non-repeating pattern smaller than 50 microns on the substrate's upper surface, and c) deposit a metal layer onto the substrate's upper surface thereby creating at least one visible image where the metal layer interfaces with and follows the dimensions of the structural feature.

In order to fully disclose the steps, the structural feature is comprised of at least one cavity on the substrate's surface, and/or at least one material object that extends outward from the substrate's surface. The metal layer is preferably deposited on the substrate by sputtering, or alternately by another form of atomic deposition such as evaporation. If necessary, or desired, a further step of removing a quantity of the deposited metal layer can be performed. When the cavity or outward extending material object is/are created, any material removed from, or placed on, the substrate is in a non-repeating pattern within the 0.25 to 50 micron range, thereby not producing visible diffraction grating.

Figure 3:
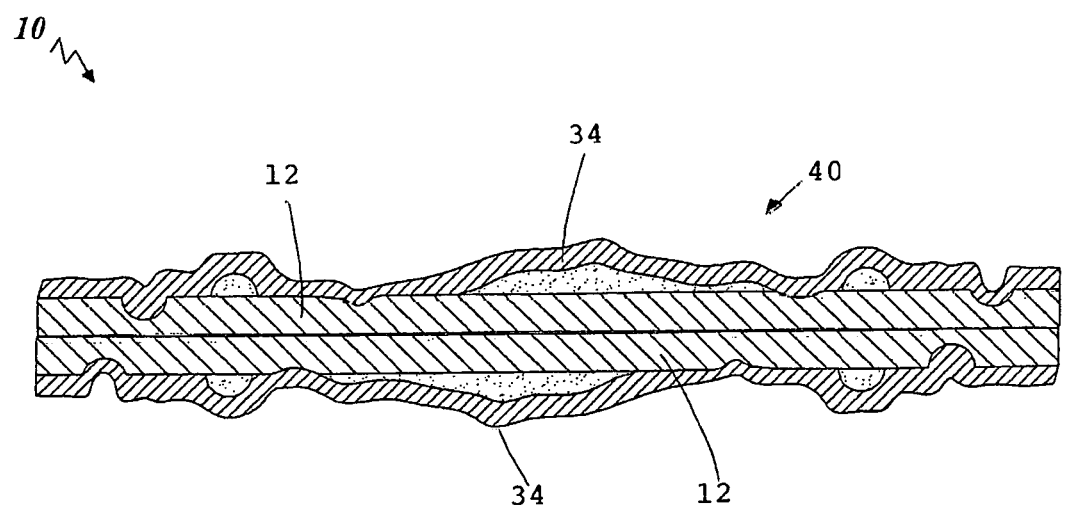
FIG. 3 is an orthographic view showing two metallic sheets that are laminated together lower surface to lower surface, thereby allowing the produced images to be visible from the upper and lower surface.

Additionally, to increase the functionality of the MSDIMM 10, two metallic sheets with deposited structured images 40 can be laminated together, lower surface to lower surface, as shown in FIG. 3, thereby allowing the produced image(s) to be visible from both the resulting upper and lower surfaces.

While the invention has been described in detail and pictorially shown in the accompanying drawings it is not to be limited to such details, since many changes and modification may be made to the invention without departing from the spirit and the scope thereof. Hence, it is described to cover any and all modifications and forms which may come within the language and scope of the claims.

The invention claimed is:

1. A metallic sheet with deposited structured images and method for manufacture (MSDIMM) wherein:
    the metallic sheet with deposited structured images comprises a substrate having a surface with a plurality of distinct structural features that are spaced apart about the surface of the substrate;
    the surface of the substrate extends beyond a periphery of the plurality of distinct structural features;
    a continuous layer of metal that is deposited onto the surface of said substrate and extends over the plurality of distinct structural features; and
    the metal layer interfaces with and follows the dimensions of the plurality of distinct structural features, thereby creating a visible image on said metal layer at locations of the plurality of distinct structural features.

2. The metallic sheet with deposited structured images and method for manufacture as specified in claim 1 wherein said substrate is made of a material selected from the group consisting of polyethylene terephthalate also known as PET; polyimide known as nylon; Kapton; polyethylene; polypropylene; polybutylene; polyolefin blends; polyolefin composites; polyolefin reinforced with uniaxially oriented polyolefin fibers; spun polyolefin; bonded polyolefin also known as Tyvek; polycarbonate, polystyrene; acrylic known as polymethylmethacrilate or PMMA; acrylonitrile butadine styrene known as ABS; polyurethane; celluosics including cellulose triacetate, cellulose diacetate known as cellophane, and blends of tri and diacetate cellulose, nitrocellulose known as gun cotton; metal foils including aluminum (Al), tin (Sn), copper (Cu), silver (Ag), zinc (Zn), indium (In); magnesium (Mg.); gold (Au), nickel (Ni); stainless steel; paper; parchment; rice paper; wood pulp paper; polymer-coated woven fabrics; and bioplastics including polylactic acid known as PLA; PolyVinylChloride known as PVC; PolyVinylFluoride known as PVF; PolyVinylideneChloride known as PVDC; PolyvinylideneFlouride known as PVDF; and PolyvinylideneAlcohol known as PVDA.

3. The metallic sheet with deposited structured images and method for manufacture as specified in claim 1 wherein said substrate further comprises a lower surface and a side edge.

4. The metallic sheet with deposited structured images and method for manufacture as specified in claim 1 wherein at least one of the plurality of distinct structural features comprises a cavity.

5. The metallic sheet with deposited structured images and method for manufacture as specified in claim 4 wherein the cavity is created by means selected from the group consisting of heat application; melting; scratching; ablating; cutting; impacting; embossing, denting; blistering, surface relief casting, reticulation, bi-phase separation deposition; mud cracking; laser ablation; etching including plasma, laser, ion beam, electron beam, chemical; bead blasting, and sand blasting.

6. The metallic sheet with deposited structured images and method for manufacture as specified in claim 1 wherein at least one of the plurality of distinct structural features comprises an outward extending material object.

7. The metallic sheet with deposited structured images and method for manufacture as specified in claim 6 wherein the outward extending material object is created by means selected from the group consisting of placing pigmented ink, placing a transparent material, spraying material, printing material, placing material by adhesion, molding, and painting, lamination, blistering, surface relief casting, reticulation, bi-phase separation, deposition sintering, laser annealing of applied colloidal suspension, selective chemical vapor deposition, electroless plating, electroplating, and low energy cauliflower growth deposition.

8. The metallic sheet with deposited structured images and method for manufacture as specified in claim 1, wherein the visible image that is created on said metal layer is selected from the group consisting of an artistic image, a textual image and an authentication image.

9. A metallic sheet with deposited structured images and method for manufacture (MSDIMM) wherein said metallic sheet with deposited structured images is comprised of:
    a) a substrate with an upper surface, a lower surface and a side edge,
    b) a plurality of distinct structural features that are spaced apart about the upper surface of said substrate, wherein the upper surface of the substrate extends beyond a periphery of the plurality of distinct structural features, and
    c) a continuous metal layer that is deposited onto the upper surface of said substrate and extends over the plurality of distinct structural features, wherein as said metal layer is deposited on said substrate, said metal layer interfaces with and follows the dimensions of said plurality of distinct structural features, thereby creating a visible image on said metal layer at locations of the plurality of distinct structural features.

10. The metallic sheet with deposited structured images and method for manufacture as specified in claim 9 wherein said substrate is made of a material selected from the group consisting of polyethylene terephthalate known as PET; polyimide known as nylon; Kapton; polyethylene; polypropylene; polybutylene; polyolefin blends; polyolefin composites; polyolefin reinforced with uniaxially oriented polyolefin fibers; spun polyolefin; bonded polyolefin also known as Tyvek; polycarbonate; polystyrene; acrylic known as polymethylmethacrilate or PMMA; acrylonitrile butadine styrene known as ABS; polyurethane; celluosics including cellulose triacetate, cellulose diacetate known as cellophane, and blends of tri and diacetate cellulose; nitrocellulose known as gun cotton; metal foils including aluminum (Al), tin (Sn), copper (Cu), silver (Ag), zinc (Zn), indium (In), magnesium (Mg.), gold (Au), nickel (Ni) stainless steel; paper; parchment; rice paper; and wood pulp paper; polymer-coated woven fabrics; and bioplastics including polylactic acid known as PLA, and PolyVinylChloride known as PVC, PolyVinylFluoride known as PVF, PolyVinylideneChloride known as PVDC, PolyvinylideneFlouride known as PVDF; and PolyvinylideneAlcohol known as PVDA.

11. The metallic sheet with deposited structured images and method for manufacture as specified in claim 9 wherein at least one of the plurality of structural features comprises a cavity on the upper surface of said substrate.

12. The metallic sheet with deposited structured images and method for manufacture as specified in claim 11 wherein the cavity is created by means selected from the group consisting of heat application; melting; scratching; ablating; cutting; impacting, embossing, denting; blistering, surface relief casting, reticulation, bi-phase separation deposition; mud cracking; laser ablation; etching including plasma, laser, ion beam, electron beam, chemical; bead blasting, and sand blasting.

13. The metallic sheet with deposited structured images and method for manufacture as specified in claim 9 wherein at least one of the plurality of structural features comprises a material object that extends outward from the upper surface of said substrate.

14. The metallic sheet with deposited structured images and method for manufacture as specified in claim 13 wherein the outward extending material object is created by means selected from the group consisting of placing pigmented ink, placing a transparent material, spraying material, printing material, placing material by adhesion, molding, and painting, lamination, blistering, surface relief casting, reticulation, bi-phase separation, deposition sintering, laser annealing of applied colloidal suspension, selective chemical vapor deposition, electroless plating, electroplating, and low energy cauliflower growth deposition.

15. The metallic sheet with deposited structured images and method for manufacture as specified in claim 9 wherein multiple cavities or material objects are used to create a pattern in the visible image.

16. The metallic sheet with deposited structured images and method for manufacture as specified in claim 9, wherein the visible image that is created on said metal layer is selected from the group consisting of an artistic image, a textual image and an authentication image.

17. The metallic sheet with deposited structured images and method for manufacture as specified in claim 9 wherein the visible image that is created is comprised of non-repeating features having dimensions less than fifty microns.

18. The metallic sheet with deposited structured images and method for manufacture as specified in claim 9 wherein said metal layer is comprised of a precious metal.

19. The metallic sheet with deposited structured images and method for manufacture as specified in claim 9 wherein said metallic sheet with deposited structured images is a form of exonumia or currency.

20. The metallic sheet with deposited structured images and method for manufacture as specified in claim 9 wherein said metal layer is deposited on said substrate by sputtering.

21. The metallic sheet with deposited structured images and method for manufacture as specified in claim 9 wherein said metal layer is deposited on said substrate by vapor deposition.

22. The metallic sheet with deposited structured images and method for manufacture as specified in claim 9 wherein said metal layer is deposited on said substrate by colloid deposition and densification.

23. The metallic sheet with deposited structured images and method for manufacture as specified in claim 9 wherein said metal layer further comprises variable thickness that is produced by means selected from the group consisting of laser etching the metal, placing pinholes in the metal, reducing areas of deposition in the metal, chemically etching the metal, and abrading the metal.

24. The metallic sheet with deposited structured images and method for manufacture as specified in claim 9 further comprising an additional metallic sheet with deposited structured images, the additional metallic sheet and the metallic sheet being laminated together lower surface to lower surface, thereby allowing the produced images to be visible from the upper and lower surface.

25. The metallic sheet with deposited structured images and method for manufacture as specified in claim 9 wherein said method for manufacture is comprised of the following steps:
    a) acquire a substrate with an upper surface, a lower surface, and a side edge,
    b) modify the substrate by creating a plurality of distinct structural features larger than fifty microns or non-repeating and smaller than fifty microns that are spaced apart about the substrate's upper surface, wherein the upper surface of the substrate extends beyond a periphery of the plurality of distinct structural feature, and
    c) deposit a continuous metal layer onto the substrate's upper surface that extends over the plurality of distinct structural features thereby creating at least one visible image where the metal layer interfaces with and follows the dimensions of the plurality of distinct structural features.

26. The metallic sheet with deposited structured images and method for manufacture as specified in claim 24 wherein at least one of the plurality of structural features comprises a cavity on the upper surface of said substrate.

27. The metallic sheet with deposited structured images and method for manufacture as specified in claim 24 wherein at least one of the plurality of structural features comprises a material object extending outward from the upper surface of said substrate.

28. The metallic sheet with deposited structured images and method for manufacture as specified in claim 24 wherein the metal layer is deposited on the substrate by sputtering.

29. The metallic sheet with deposited structured images and method for manufacture as specified in claim 24 further comprising a step of removing a quantity of the deposited metal layer.

30. The metallic sheet with deposited structured images and method for manufacture as specified in claim 24 further comprising when at least one of the plurality of structural features is created, any material removed from the substrate or placed on the substrate is in a non-repeating pattern within the 0.25 to 50 micron range, thereby not producing visible diffraction grating.

* * * * *